HIGH-Q, HIGH-FREQUENCY SILICON/SILICON-DIOXIDE CAPACITOR

Filed Dec. 27, 1967

INVENTOR:
RANDOLPH C. EARLY
BY J. Darrell Blumenfeld
HIS ATTORNEY.

United States Patent Office 3,518,498

Patented June 30, 1970

3,518,498

HIGH-Q, HIGH-FREQUENCY SILICON/SILICON-DIOXIDE CAPACITOR

Randolph C. Early, Lynchburg, Va., assignor to General Electric Company, a corporation of New York Filed Dec. 27, 1967, Ser. No. 693,816
Int. Cl. H01l 3/00
U.S. Cl. 317—230 8 Claims

ABSTRACT OF THE DISCLOSURE

A silicon/silicon-dioxide capacitor construction having Q's in the order of 600 to 800 at 10 mHz. is described. The Q's of gold-silicon die-bonded silicon/silicon-dioxide capacitors at frequencies of 10 megahertz were found to be substantially below theoretically attainable Q's at this frequency. Investigation indicated that in die-bonding, a low-grade P-N rectifying junction is formed at the junction of the bulk silicon and the gold-silicon eutectic, substantially reducing the Q of the capacitor at high frequencies. By adding gold/antimony preform to the conductor surface prior to die-bonding, the antimony, acting as an n dopant, prevents the formation of the P-N rectifying junction at the interface.

The instant invention relates to a capacitor device and a method for fabricating the same and, more particularly, relates to a high-frequency silicon/silicon-dioxide capacitor having a high Q.

With the rapid development of microcircuit electronics, capacitor elements having mechanical, electrical, and size characteristics compatible with microelectronic techniques are required. This has resulted in capacitor constructions and configurations which represent departures from traditional constructions and modes of fabrication for these devices. One of the capacitor constructions meeting the needs of microelectronic techniques is the silicon/silicon-dioxide capacitor which consists of a block of silicon, a thin layer in the order of 1,000 to 10,000 Angstroms of silicon-dioxide, which is thermally grown on the surface of the silicon, and an evaporated aluminum electrode deposited on the silicon dioxide. The bulk silicon is heavily n doped to provide resistivities of $1/10$ to $1/1000$ ohms per centimeter to enhance the Q of the device and to minimize the dissipation factor (1/Q). This capacitor element or chip is bonded to a conductor to form a second electrode. The ohmic contact between the metallic conductor and the silicon surface is formed by die-bonding the capacitor chip to a substrate having a thin surface layer containing gold so that a gold/silicon eutectic bond is formed between the metallic substrate and the bulk silicon. It has been found, however, that these silicon/silicon-dioxide capacitors have a low Q at high frequencies. At 10 megahertz, for example, the Q is substantially below the theoretically attainable Q. In fact, the silicon/silicon-dioxide capacitors have not been used at high frequencies because of this fact, and have hitherto found their primary application at relatively low frequencies in the 1 to 50 kilohertz range.

Applicant has discovered that this reduction in the Q of the capacitor at high frequencies and the concomitant increase in the dissipation factor is attributable to the fact that a P-N-rectifying junction is formed at the interface of the bulk silicon and the gold-silicon eutectic during the die-bonding process, by the trapping of gold atoms at the interface. These gold atoms act as p dopants to the n-type silicon to form the junction. This rectifying junction, of course, adds resistance in series with the resistance of the bulk silicon so that the series resistance for the capacitor which controls the dissipation factor and Q is substantially increased. This series resistance is the major limiting factor on the Q of the device as the frequency increases.

A need, therefore, exists to provide a silicon/silicon-dioxide capacitor in which the effects of the trapped gold atoms are neutralized so that no rectifying P-N junction is formed at the interface of the silicon and the gold-silicon eutectic.

It is, therefore, a primary objective of this invention to provide a high-Q silicon/silicon-dioxide capacitor at high frequencies.

It is a further objective of this invention to provide a method for fabricating these silicon/silicon-dioxide capacitors to produce a high-Q capacitor at high frequencies.

A still further objective of the invention is to provide a silicon/silicon-dioxide capacitor having a Q at the higher frequencies which closely approaches the theoretically attainable Q of the device at that frequency.

Other objectives and advantages of the invention will become apparent as the description thereof proceeds.

The various objectives and advantages of the instant invention may be realized by providing a silicon/silicon-dioxide capacitor in which an ohmic contact between the bulk silicon and a metallic conductor is provided by forming a gold/silicon eutectic bond which contains traces of an n-dopant such as antimony. This prevents the formation of a rectifying P-N junction at the interface of the bulk silicon and the eutectic due to the trapping of gold atoms. To this end, a gold preform is added to the surface of the metallic conductor that contains a small amount of antimony. During die-bonding, as the gold and silicon melt at the eutectic temperatures to form the eutectic composition, sufficient antimony, which acts as an n-dopant, is present at the interface to neutralize any gold, which acts as a p-dopant, trapped at the interface. As a result, no P-N junction is formed at this interface, the series resistance of the device is substantially reduced and high Q's at the desired high frequencies are possible.

The novel features which are believed to be characteristic of this invention are set forth with particularity in the appended claims. The invention, both as to its organization and method of operation, together with further objectives and advantages thereof, may best be understood by reference to the following description, taken in connection with the accompanying drawings in which:

Figure 1:
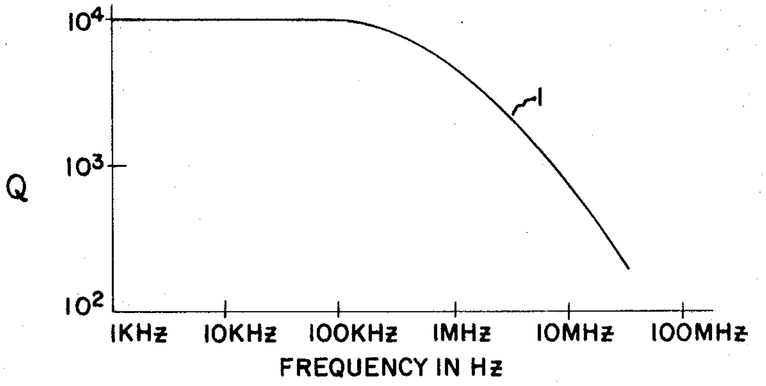
FIG. 1 is a graph illustrating the relationship of Q as a function of frequency.

As pointed out briefly in the opening discussion, the Q or quality factor of a silicon/silicon-dioxide capacitor is frequency-sensitive in that the Q of the device varies as a function of frequency because of the series resistance of the capacitor due to the resistivity of the bulk silicon, as well as the resistance of the contacts and leads of the device. FIG. 1 shows a plot of the Q of a 100 pf. silicon/silicon-dioxide capacitor as a function of the frequency. As can be seen from Curve 1, from 1 to 100 kilohertz, Q's of 10,000 are realizable. Thereafter, the Q drops rapidly until a Q of approximately 250 is theoretically attainable at 20 megahertz. It may also be noted that at 10 megahertz the theoretical Q of a silicon/silicon-dioxide capacitor is approximately 900. For a more detailed discussion of the characteristics of silicon-dioxide capacitors in terms of Q, temperature response, etc., reference is hereby made to an article entitled "Titanium Oxide and Silicon Oxide Capacitors for Microminiature Functional Circuits," written by H. G. Gruetenberg, J. R. Johnson, and L. C. White, published in the August 1962 issue of "Solid-State Design."

However, in actually fabricating silicon/silicon-dioxide capacitors and, particularly, after die-bonding to a metallic conductor, it was found that the Q at 10 megahertz was at best only 400 with values ranging as low as 100. This wide variance between the theoretically attainable Q and the Q's actually obtained in practice is found to be the result of die-bonding the silicon/silicon-dioxide capacitor chip to a metallic conductor. To understand fully the nature of the problem, its cause, and the solution conceived by applicant, a discussion of the known fabrication techniques for these capacitors will be useful. The silicon/silicon-dioxide capacitor chip is formed by any number of well known processes and such silicon/silicon-dioxide capacitor chips are commercially available from a number of capacitor vendors. Customarily, the starting material is a semiconductor grade of silicon heavily n-doped to provide resistivities of less than 0.10 per ohm centimeter and preferably less than 0.001 ohm centimeter. The silicon is cleaned, polished, and etched and then the silicon surface is oxidized in wet oxygen at temperatures of 1,000 to 1,200° C. for several hours. This process of oxidizing and heating, of course, thermally grows a silicon-dioxide layer in the range from 1,000 to 10,000 Angstroms on the surface of the bulk silicon, with the silicon dioxide acting as the insulating layer of the capacitor. An electrode, typically of aluminum, is then vacuum-deposited on the surface of the silicon-dioxide layer through a suitable mask to form one of the capacitor electrodes. The silicon/silicon-dioxide capacitor chip is then die-bonded to a metal substrate. To facilitate the die-bonding at reasonable temperatures and under reasonable process conditions, the substrate has a thin layer of gold at its surface so that a gold/silicon eutectic bond is formed between the substrate and the bulk silicon of the capacitor. The gold/silicon eutectic temperature, about 370° C., is well below the melting points of either gold or silicon, which are respectively 1063° C. and 1404° C.

The gold layer on the surface of the metallic substrate may be formed in any number of ways. For example, the layer may be formed by utilizing a platinum/gold conductor suspension and baking it on the substrate surface. A platinum/gold powder (having a gold to platinum ratio from 3 to 1 to 4 to 1) such as the one commercially available and sold by the DuPont Corporation of Wilmington, Del., under the designation of "Gold Conductor Composition No. 7553," is suspended in an organic vehicle of any suitable nature along with a glass frit or vitreous binder. The suspension containing the glass frit and the gold and platinum powder is deposited on the surface of an insulating substrate, such as alumina, for example, or any ceramic material in any suitable way, as by screening or painting, for example. The substrate is then fired at approximately 950° C. for 20 to 30 minutes. The glass frit and the precious metal powder are baked firmly onto the surface of the insulating substrate to form the desired layer of conducting material.

The silicon/silicon-dioxide chip is then die-bonded to the metla substrate by heating the chip and substrate in a heating chamber to approximately 400° C., a temperature above the eutectic temperature. The die bonding takes place in the presence of an inert atmosphere, i.e., in nitrogen, or in a reducing atmosphere, i.e., hydrogen and nitrogen, to reduce any surface oxides. As the bulk silicon and the gold-covered metallic substrate heat to the eutectic temperature of 370° C., atoms of each metal begin diffusing at the interface of the metal. When the eutectic point is reached, a very thin liquid layer forms at the interface, and this liquid phase very rapidly dissolves both metals in the appropriate proportions to form a volume of eutectic alloy. The eutectic alloy for a silicon and gold system at 370° C., consists of approximately 8% silicon and 92% gold. For a further discussion and further details of the gold/silicon phase diagram, reference is hereby made to the text Transistor Technology, volume 3, edited by F. J.

Biandi, and published by the D. Van Nostrand Company, Inc., Princeton, N.J. (1958) and particularly to page 233 thereof.

If the capacitor chip and the metallic conductor are, however, heated beyond the eutectic temperature (370° C. for the gold/silicon system), more and more silicon is dissolved in the liquid phase as may be seen by reference to the phase diagram in the above text. When the system is then cooled below the eutectic temperature, the additional silicon is rejected from the liquid during the cooling, forming a regrowth layer of silicon at the interface between the bulk silicon and the silicon/gold eutectic. This regrowth layer contains a small percentage of gold as determined by the solid solubility of the gold in silicon (approximately 0.001). The liquid silicon/gold eutectic alloy "freezes" to form the desired ohmic contact. However, in the regrowth layer of the silicon crystal, there are now a number of gold atoms trapped, atoms which are p-type dopants, and a P-N rectifying junction is formed at the interface between the regrowth layer and the original, bulk silicon. Thus, even though the bulk silicon started out as a heavily doped n-type, the gold atoms trapped in the recrystallized silicon exceed the n-type dopants in the recrystallized silicon, and produce the undesired P-N junction which adds to the resistance of the capacitor and, hence, substantially reduces the Q.

In order to prevent formation of this P-N junction, applicant has discovered that the trapped gold atoms in the regrowth layer of silicon may be neutralized by providing at the surface of the metallic substrate to which the capacitor is to be bonded a metal which acts as an n dopant, and will be absorbed and trapped in the regrown crystal area in the same percentage as the p dopant gold atom. To this end, a gold and antimony preform, containing approximately 0.4% to 0.6% of antimony is added to the gold/platinum surface layer on the ceramic substrate so that as the eutectic temperature is approached and the thin liquid layer forms at the interface, the antimony is also dissolved in sufficient proportions to diffuse at the interface. As the eutectic temperature is exceeded, there is sufficient antimony in the liquid that upon cooling below the eutectic temperature, sufficient antimony is trapped in the silicon regrowth layer to neutralize the effect of any trapped gold atoms and prevent the formation of the P-N rectifying junction at the interface between the regrown silicon crystal and the bulk crystal. The range of antimony may be between .2% and .6%. Below .2% not enough antimony is available and beyond .6%, precipitation can occur and also changes in the eutectic temperature can take place.

Arsenic may also be used as an n dopant in place of antimony. However, because of the health hazards usually associated with the use of arsenic, antimony is the preferred material.

Figure 2:
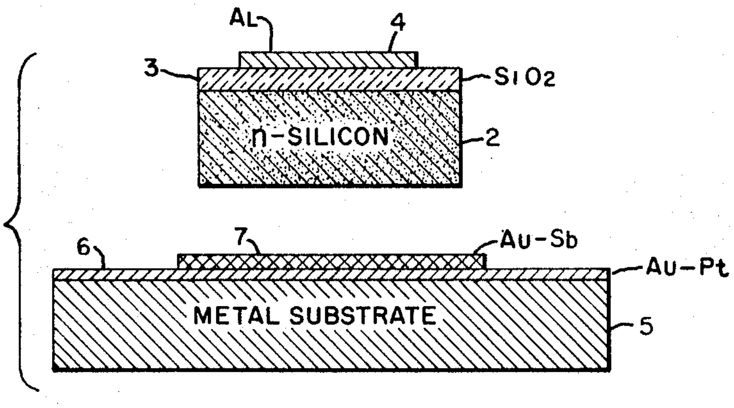
FIG. 2 is a diagram illustrating one of the fabricating steps for the capacitor of the instant invention.

FIG. 2 illustrates the silicon/silicon-dioxide arrangement prior to forming the ohmic contact between the silicon/silicon-dioxide chip and the metallic conductor. Thus, the silicon chip consists of a heavily doped n silicon layer 2, having a thin layer of silicon dioxide 3 thermally grown on the surface of the bulk silicon. An aluminum electrode 4 is vacuum deposited on the surface of the silicon dioxide and constitutes one electrode of the capacitor. The ceramic substrate to which the capacitor chip is to be bonded consists of a layer of any metallic substance 5, such as copper, etc., having deposited or baked on the surface thereof a thin layer 6 (approximately one millimeter in thickness) of a gold/platinum composition. The gold forms a eutectic alloy with the silicon in the chip to provide ohmic contact between the chip and the metallic conductor. The platinum in the gold composition is provided, not for enhancing the formation of the eutectic alloy, but in order to provide a slightly harder and more solderable surface for the metal conductor. Positioned on top of the gold/platinum layer 6 is a gold antimony preform 7, which contains anywhere from 0.4% to 0.6% of antimony with 0.5% being the preferred proportion. The preform, in a preferred embodiment, consists of a 1-mil thick ribbon, and is placed directly on the gold and platinum surface. The silicon chip and the substrate consisting the gold/platinum surface film as well as the gold antimony preform are placed in a heated chamber which contains either an inert or a reducing atmosphere. The temperature of the substrate and the silicon chip is raised to approximately 400° C., and pressure applied on the chip positioned on the surface of the substrate. As soon as the liquid film between the substrate and the chip placed thereon is noted, a time period taking no more than several seconds at 400° C., the chamber may be cooled and the capacitor removed, at which time the liquid film cools below the eutectic temperature to form the eutectic alloy and the ohmic contact between the substrate and the capacitor chip. The antimony n-dopant is preferably added by use of a preform positioned on the surface of the gold-platinum conducting layer. It will be appreciated, however, that the antimony may be baked onto the surface along with the gold-platinum by adding it in powder form to the suspension used to form the conducting layer.

Figure 3:
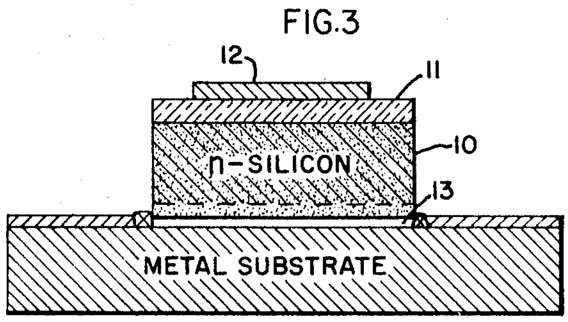
FIG. 3 is a diagram of the structure of the silicon/silicon-dioxide capacitor of the instant invention.

FIG. 3 illustrates the diagram of the finished capacitor product and again contains a layer of heavily n-doped bulk silicon 10, having a thermally deposited layer of silicon dioxide 11 on one surface thereof, and an evaporated aluminum electrode 12 on the upper surface of the silicon dioxide. The lower portion of the bulk silicon 10 makes an ohmic contact with a ceramic substrate 13, with the ohmic contact taking place through a thin layer of eutectic alloy 14, containing approximately 92% gold and 8% silicon, as well as sufficient traces of antimony to neutralize any trapped gold atoms at the interface between the bulk crystal and the regrowth silicon layer 15, by virtue of this additional trace of antimony in the regrowth layer, formation of the P-N junction at this interface is prevented, and a high-Q, high-frequency silicon/silicon-dioxide capacitor fabricated.

In order to compare the characteristics of capacitors embodying the invention with those previously available, 120 silicon/silicon-dioxide capacitors manufactured by the prior-art process, i.e., without the use of the gold antimony preform to provide the trace of antimony to neutralize the trapped gold atoms, were tested and their Q at 10 mHz. measured. None of the 120 capacitors had a Q above 400 (as compared to the theoretical value of 900). A majority of the capacitors had measured Q's of closer to 100 than to 400. Correspondingly, a similar number of capacitors manufactured by use of the process using the gold antimony preform to inject trace amounts of antimony into the regrowth area of the bulk silicon were also tested at 10 megahertz, and their Q's determined. None of the capacitors had a Q of less than 600 and many of the capacitors had Q's of 800 (as compared to the theoretical limits of 900). It can be seen, therefore, that the silicon/silicon-dioxide capacitor composition of the instant invention is one which provides substantial improvements of Q at very high frequencies in the order of 10 megahertz by utilizing the process described in the instant application for injecting a trace of antimony at the eutectic alloy bond area of the capacitor to thereby eliminate the P-N junction normally formed at this interface.

While a particular embodiment of this invention has been shown, it will, of course, be understood that the invention is not limited thereto, with many modifications, both in the composition and in the instrumentalities and processes employed, may be made. It is contemplated by the appended claims to cover any such modifications as fall within the true spirit and scope of this invention.

What is claimed as new and desired to be secured by Letters Patent of the United States is:

1. A high-Q, high-frequency silicon/silicon-dioxide capacitor comprising:

(a) a first layer of n-type bulk silicon,
(b) a second layer of silicon-dioxide on one surface of said silicon,
(c) a metallic third layer covering at least a portion of said second layer and forming one electrode of said capacitor,
(d) and a metallic substrate making an ohmic contact on another surface of said silicon to form the other electrode of said capacitor; said ohmic contact including a fourth layer of gold-silicon eutectic alloy between said substrate and said silicon; and said fourth layer including an n-type dopant for preventing formation of a P-N junction at the interface between said substrate and said silicon.

2. The silicon/silicon-dioxide capacitor according to claim 1 wherein said n-type dopant consists of antimony.

3. A high-Q, high-frequency silicon/silicon-dioxide capacitor comprising:

(a) a first layer of n-type bulk silicon,
(b) a second layer of silicon-dioxide on one surface of said silicon,
(c) a metallic third layer covering at least a portion of said second layer and forming one electrode of said capacitor,
(d) and a metallic substrate making an ohmic contact on another surface of said silicon to form the other electrode of said capacitor; said ohmic contact comprising a stratum of silicon-gold eutectic alloy and a regrowth stratum of silicon containing an n-dopant distributed therethrough for preventing formation of a P-N junction.

4. The silicon/silicon-dioxide capacitor according to claim 3 wherein said n-dopant consists of antimony.

5. In a process for forming a high-Q, silicon/silicon-dioxide capacitor, the steps comprising:

(a) forming a capacitor chip having a silicon-dioxide layer on the surface of an n-type bulk silicon and a metallic electrode on said silicon dioxide,
(b) forming an ohmic contact between a metallic substrate and said bulk silicon on a surface spaced from said silicon-dioxide layer including, placing said substrate, with gold and an n-type dopant therewith, in contact with said spaced surface and heating said substrate above the eutectic temperature to form a gold-silicon eutectic alloy and to produce diffusion of the n-type dopant into an ohmic contact stratum between said silicon and said substrate for preventing formation of a P-N junction at the interface of said bulk silicon.

6. The process according to claim 5 wherein antimony is said n-type dopant.

7. The process according to claim 5 comprising, positioning a gold-antimony composition consisting of .4% to .6% antimony between a gold layer on the surface of said substrate and heating said bulk silicon and the entire assembly above the eutectic temperature.

8. The process according to claim 7 comprising first heating said entire assembly above the eutectic temperature to form said eutectic alloy and diffuse antimony into said silicon, and then cooling said entire assembly below the eutectic temperature to freeze said eutectic alloy and trap sufficient antimony to neutralize the effects of any excess trapped gold.

References Cited

UNITED STATES PATENTS

| | | | |
|---|---|---|---|
| 2,854,612 | 9/1958 | Zaratkiewicz | 317—240 |
| 2,898,528 | 8/1959 | Patalong | 317—240 |
| 2,934,685 | 4/1960 | Jones | 317—235 |
| 3,384,829 | 5/1968 | Sato | 317—234 X |
| 3,400,310 | 9/1968 | Darendorf et al. | 317—234 |

JAMES D. KALLAM, Primary Examiner

U.S. Cl. X.R.

317—234, 258